United States Patent [19]

Schelhorn

[11] 4,393,438
[45] Jul. 12, 1983

[54] PORCELAIN COATED METAL BOARDS HAVING INTERCONNECTIONS BETWEEN THE FACE AND REVERSE SURFACES THEREOF

[75] Inventor: Robert L. Schelhorn, Cinnaminson, N.J.

[73] Assignee: RCA Corporation, New York, N.Y.

[21] Appl. No.: 328,435

[22] Filed: Dec. 7, 1981

Related U.S. Application Data

[62] Division of Ser. No. 133,255, Mar. 24, 1980, Pat. No. 4,328,614.

[51] Int. Cl.³ .............................................. H05K 1/18
[52] U.S. Cl. .................................. 361/401; 174/52 H; 174/52 S; 361/400; 361/411
[58] Field of Search .................. 174/68.5, 52 H, 52 S; 361/401, 411, 400; 339/275 R, 275 C

[56] References Cited

U.S. PATENT DOCUMENTS

| Re. 27,089 | 3/1971 | Sear et al. ....................... 361/401 X |
| 3,676,292 | 7/1972 | Pryor .............................. 174/52 H X |
| 4,221,925 | 9/1980 | Finley et al. ....................... 174/68.5 |
| 4,254,172 | 3/1981 | Takahashi et al. ............ 174/68.5 X |
| 4,303,715 | 12/1981 | Chang .............................. 174/68.5 X |

OTHER PUBLICATIONS

Leland Teschler, New Circuit Boards Beat Heat and Vibration, Machine Design, vol. 51, #2, Jan. 25, 1979; pp. 105 to 109.

*Primary Examiner*—R. R. Kucia
*Attorney, Agent, or Firm*—Birgit E. Morris; Edward J. Sites

[57] ABSTRACT

In accordance with this invention a porcelain coated metal board is provided which has flat surfaces and further has electrical connections between the face and reverse surfaces of the board. In accordance with a further aspect of this invention the boards of this invention are obtained by a method in which the connecting pins are sealed in a spaced relationship in apertures in the metal core of the board and insulated from the core prior to the application of the porcelain to the surfaces of the core.

1 Claim, 10 Drawing Figures

PORCELAIN COATED METAL BOARDS HAVING INTERCONNECTIONS BETWEEN THE FACE AND REVERSE SURFACES THEREOF

This is a division of application Ser. No. 133,255, filed Mar. 24, 1980, now U.S. Pat. No. 4,328,614.

This invention relates to porcelain coated metal boards for use in electronic devices. More particularly, this invention is concerned with porcelain coated metal boards which have connections between the face and reverse surfaces of the board and with the method of manufacturing the boards.

BACKGROUND OF THE INVENTION

Porcelain coated metal boards are recognized as having many advantages in comparison to organic plastic boards for use in electronic devices. The porcelain coated metal boards, hereafter referred to as porcelain boards, are inherently more resistant to physical damage and chemical attack than organic plastic boards. The porcelain boards can be employed over a wider range of temperatures than organic plastic boards and are particularly useful at elevated temperatures.

Certain problems have, however, been encountered with procelain boards which have heretofore limited their full potential utilization. The design, rules, and practices of the electronic industry require that circuit assembly be as compact as possible. This requires that the electrical circuitry and the components which comprise the electronic devices be packed as closely as possible on the circuit boards. To reduce the physical size and to facilitate the assembly to the devices it has become standard practice to place electronic components on both the face and reverse surfaces of circuit boards. This technique requires a large number of apertures through the boards for making electrical connections between the face and reverse surfaces of the circuit boards.

Many of the electronic components comprising the circuitry are now formed by using thick film techniques in which the desired components or circuits are printed directly on one or both surfaces of the circuit boards. In order to obtain maximum packing and accurate reproduction of electronic elements by thick film techniques, it is necessary that the areas of the circuit boards which are printed be as flat as possible. The flatness requirement has not proven to be a problem with the organic plastic boards as they can readily be manufactured in a flat configuration and apertures can be drilled or punched through the board without distorting the overall flatness. The porcelain boards heretofore available, especially those having apertures for making electrical connections between the face and the reverse surfaces thereof have, however, not been sufficiently flat, especially around the apertures, for use in thick film processes. This inherent lack of flatness of the porcelain boards heretofore available restricts the relative amount of surface area which can be utilized for printed circuits. This causes significant problems in reducing the physical size of the circuits formed by these porcelain boards in comparison to similar circuits formed on organic plastic boards.

Certain unique problems have also been encountered in making electrical connections between the face and the reverse surfaces of porcelain boards as compared to the organic plastic boards. When an organic plastic board is employed, the organic plastic being comprised of a dielectric material provides the required insulation for the electrical leads which passes through the board. When it is desired to make a direct connection between circuitry on opposite sides of an organic plastic board, plated through holes or the like can be provided by well-known techniques.

The provision of connections through porcelain boards, however, presents considerably more problems. Porcelain boards have conductive metal cores. If the metal core is used as a common ground plane, it is essential that the leads from the electronic components do not inadvertantly contact the metal core and short to ground. Even if the metal core is not used as a common ground plane, contact by the exposed leads of electronic components with the conductive metal core can cause shorts between components mounted on the board through the metal core of the board. It is therefore recognized that the walls of the apertures through the porcelain boards must be well insulated with a dielectric material.

The prior art techniques of providing connections between the surfaces of porcelain boards results in a considerable waste of valuable surface area on the face and referse sides of the board. Typically the amount of area required for making a connection through porcelain boards is about 10 times that required for an organic plastic board. In addition the number of separate steps required to provide the connections as well as certain problems which are encountered when insulating the metal core as noted above significantly add to the manufacturing cost of porcelain boards in comparison to organic plastic boards.

It would be a substantial advantage if a method of manufacture could be provided for porcelain boards in which connections between the face and the reverse surface thereof could be made with fewer, less costly process steps and which would provide a finished porcelain board having more usable surface area.

SUMMARY OF THE INVENTION

In accordanc with this invention, a porcelain board is provided which has connections between the face and reverse surfaces and which is sufficiently flat so as to allow substantially full utilization of the surface for the formation of printed circuit components and for the compact mounting of discrete electronic components. The method which is disclosed to form the porcelain boards is comprised of the steps of forming the metal core with the required apertures, sealing connecting pins in place in the apertures with a glass frit and thereafter porcelainizing the entire assembly to provide a flat surface porcelain board with the connecting pins extending through to each surface.

DETAILED DESCRIPTION OF THE INVENTION

In order to facilitate an explanation of the present invention and to further demonstrate the advantage obtained with the present invention the processes employed in the prior art will be briefly described.

Figure 1:
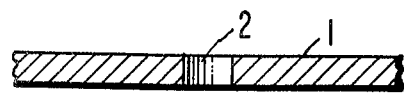
FIGS. 1 to 3 are illustrations in cross-section of the process used in the prior art for providing insulated apertures through porcelain boards.
Figure 2:
Figure 3:
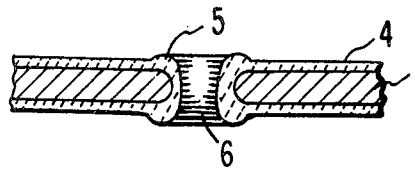

FIGS. 1, 2, and 3 taken together illustrate a typical procedure followed in the prior art for providing insulated apertures in porcelain boards. A metal core 1 is initially blanked out and then shaped into the desired configuration. An aperture 2 is provided in the board by drilling, punching or other conventional methods. The metal core 1 is then preferably subjected to a second mechanical working wherein the aperture 2 is re-stamped or reworked to provide a beveled aperture 3. The metal core 1 is then coated with a porcelain frit. The porcelain frit coated metal core is fired to the melting temperature of the frit. During the firing process the porcelain frit melts and, the porcelain 4 flows on the surface of the metal core 1, particularly in the areas about the aperture 3. As the result of this flow and the characteristics of the porcelains employed, a meniscus 5 builds up about the aperture 3. The porcelain coated aperture 6 which results can be used as a passage for feeding electric leads through the board in that the leads will be insulated from the metal core 1 by the coating of porcelain 4 about the edges of the aperture 3.

Figure 4:
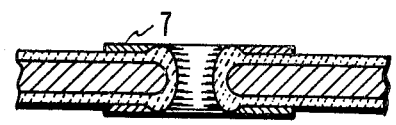
FIGS. 4 and 5 are illustrations in cross-section of a prior art method of providing a pin connector between the face and reverse surfaces of porcelain boards.
Figure 5:
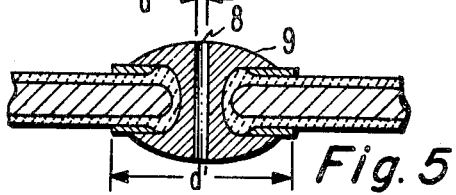

In applications where it is desirable to have an electrical connection between the surfaces of the porcelain board, the connections are made in the prior art as illustrated in FIGS. 4 and 5. A metal pad 7 is formed about the edges of the aperture 6 at a slight distance from the meniscus 5. The coating is generally formed by thick film techniques to provide, for example, a copper coating on the board. Thereafter a connector pin 8 is inserted through the aperture 6 and held in place by solder 9 or a similar material.

Figure 6:
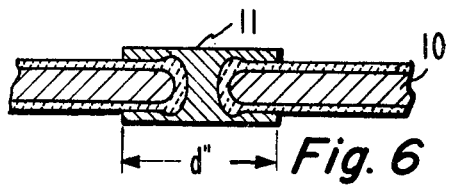
FIG. 6 is an illustration in cross-section of a porcelain board having a plated through connector provided in accordance with the teachings of the prior art.

Another method commonly used in the prior art is to form a plated through connector such as is illustrated in FIG. 6. The porcelain coated board 10 is plated using for example thick film techniques with a material which is subsequently fired to form a plated through connector 11.

In FIG. 5 it can be seen that the diameter d' of the area which is required to make the connector is very substantial in comparison to the diameter d of the actual connector 8.

Figure 9:
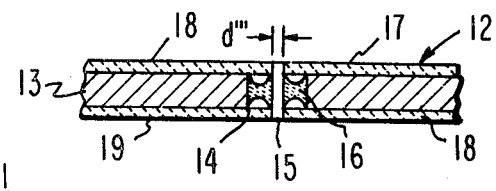
Figure 10:
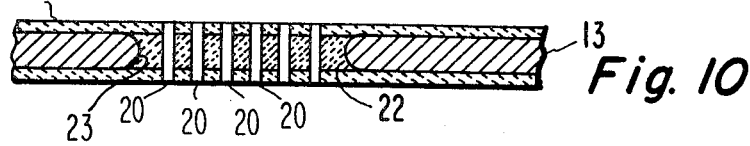
FIG. 10 is an illustration in cross-section of an alternate embodiment of the present invention which has a plurality of connectors between the face and reverse surfaces of a porcelain board with all of the connectors extending through the same aperture in the metal core.

A porcelain board of the present invention 12 is illustrated in FIG. 9. The porcelain board 12 has a metal core 13 in which there is defined an aperture 14. Within the aperture 14, there is mounted a connector pin 15 which is held in place by a fused glass frit material 16. Both surfaces of the metal core 13 are coated with porcelain layers 17, 18. The ends of the connector pin 15 extend through the porcelain layers 17, 18 to provide an electrical connection between the face and reverse surfaces of the porcelain board 12. The face surface and the reverse surfaces of the porcelain board 12 are flat. Substantially the entire surface area of the board can be used for the application of printed circuits or for mounting of discrete electrical components as is presently possible with the organic plastic boards. The resulting porcelain coated boards of this invention 12, however, have the high performance characteristics of the porcelain boards of the prior art.

Figure 7:
FIGS. 7 to 9 are illustrations in cross-section of the method of the present invention for providing a connection between the face and reverse surfaces of a porcelain board.
Figure 8:
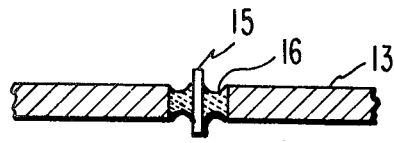

The porcelain boards of the present invention 12 are manufactured by the method which is illustrated in FIGS. 7, 8, and 9. The metal core 13 of the board 12 is comprised of any suitable metal such as those heretofore used in the manufacture of the porcelain boards. The preferred metal for use in the porcelain boards from a standpoint of relative cost and ease of machinability is low carbon steel.

The metal core 13 is initially formed into a shape so that the final porcelain board will have the required configuration. Apertures 14 are drilled or punched through the metal core 13 in the conventional manner. The size of the apertures 14 is sufficiently large that there is sufficient space between the walls of the aperture 14 and the connector 15 for an amount of dielectric sealing material to be inserted which will have insulating properties at least equivalent to that of porcelain applied to the surfaces of the board. The next major step in the manufacture of the porcelain board is the insertion of the conductor pin 15 through the aperture 14 in the metal core. As illustrated in FIG. 8, the conductor pin 15 is generally cylindrical in shape. However, it should be noted that the connector pin can be of various configurations such as being round, square, tubular, or the like. In addition, for certain applications it is also possible to use as the connector a tubular member of a dielectric material so that a bare conductor can be passed through the board from one side to the other if desired. The connector pin 15 is placed in aperture 14 at an approximately uniform distance from the walls of the aperture 14 and held in place by a powdered glass frit material 16. The glass frit 16 on firing as noted below, seals and holds the connector pin 15 in position within the aperture 14. The glass frit which is preferably selected should have a melting point which is the same or higher than the frit which is utilized to apply the porcelain coating 17 to the surface of the board 12. The connector pin 15 is held in position by the fused glass frit after the glass frit has been fired, with the terminal ends of the connector extending at least up to and through the outer surface of the porcelain after the porcelain is applied to the core 13. It should be appreciated, however, that the pins can be lower if so desired in order to provide posts or the like for connecting electrical components to the boards.

Various methods can be used for inserting and locating the pin 15 in the core 13. One of the preferred methods which has been found is to provide a jig (not shown) on which the metal core 13 is placed. Holes are provided in the jig so that the pins 15 can be inserted so to have their height positioned correctly for the later porcelainization steps. Using the jig to hold the metal core 13 and pins 15 in a spaced relationship the powdered glass frit 16 is inserted into the space about the pins 15. The assembly of the metal core 13, the pin 15 and the unfired glass frit is then heated to the fusion temperature of the glass frit which melts and adheres to the pin 15 and the metal core 13. The combination is then allowed to cool in preparation for the next step. The intermediate product which is obtained is illustrated in FIG. 8. The final step in the method of manufacture of the boards of this invention is to apply a porcelain coating to the surface of the metal core 13. The porcelain is applied in a uniform layer across the surface of the board up to and about the connectors 15.

When the porcelain frit is fired it forms a uniform flat layer across the entire surface 18 of the boards. If required, after firing the ends of the pins 15 can be slightly abraded to provide clean connections between the surfaces 17 and 18 on the upper and lower portions of the board 12.

By reference to the FIGS. 5 and 6 of the prior art it can be seen that the respective diameters d' and d" of the area required to provide the connections between the face and back surfaces of the porcelain board are many times greater than the diameter of the area d'" of the porcelain board of the present invention 12.

The present invention has been specifically illustrated showing the installation of a single pin connector between the face and reverse surfaces of a porcelain circuit board. It should be appreciated, however, that there are various modifications which are also within the scope of the present invention. For example, it has been found advantageous for certain types of the circuits to provide a plurality of connectors 20 between the face surface 21 and reverse surface 22 of the porcelain board wherein all connectors 20 are placed through this same aperture 23 in the porcelain board.

There are certain other variations and modifications of the present invention which would be obvious to those skilled in the art once having been advised of the present disclosure and these modifications are likewise included within the scope of the present invention and the subjoined claims. Such modifications would include for example the use of other types of interconnectors such as tubular dielectric connectors, and also the sealing of discrete electrical components within the porcelain board by the method described herein for the insertion of the connectors.

What is claimed is:

1. A porcelain coated metal board of a given thickness comprised of, in combination, a metal core having defined therein an aperture of a predetermined cross-sectional size, a connector having a length sufficient to extend through at least the entire thickness of said board and having a cross-sectional size less than said predetermined cross-sectional size of the aperture, a glass sealing member and first and second porcelain layers, said metal core being positioned between said porcelain layers, said connector being positioned within said aperture in a spaced apart relationship from the edges of the aperture and being oriented so as to extend through the entire thickness of said board, said glass sealing member being formed in the aperture between the connector and the edges of the aperture thereby holding said connector in said position relative to the metal core and said first and second layers of porcelain being formed about said connector in a flat configuration.

* * * * *